United States Patent [19]
Galbiati et al.

[11] Patent Number: 5,629,558
[45] Date of Patent: May 13, 1997

[54] SEMICONDUCTOR DIODE INTEGRATED WITH BIPOLAR/CMOS/DMOS TECHNOLOGY

[75] Inventors: Paola Galbiati, Monza; Ubaldo Mastromatteo, Cornaredo, both of Italy

[73] Assignee: SGS-Thomson Microelectronics, S.rl, Agrate Brianza, Italy

[21] Appl. No.: 454,647

[22] Filed: May 31, 1995

[30] Foreign Application Priority Data

May 31, 1994 [EP] European Pat. Off. ............ 94830266

[51] Int. Cl.⁶ ................... H01L 27/06; H01L 31/0352; H01L 29/00
[52] U.S. Cl. ................... 257/653; 257/654; 257/546
[58] Field of Search ..................... 257/13, 14, 79, 257/85, 95, 97, 99, 292, 435, 546, 609, 615, 653, 654, 666

[56] References Cited

FOREIGN PATENT DOCUMENTS 0283066 5/1995 European Pat. Off. .
8300776 5/1995 WIPO .

OTHER PUBLICATIONS

Parthasarathy et al., Theoretical and Experimental Investigation of 500V P– and N– Channel VDMOS–LIGBT Transistors, Proceedings of 1995 International Symposium of Power Semiconductor Devices & ICs, pp. 241–246 1995.
Leung et al., Self–Heating Effect in Lateral DMOS on SOI, Proceedings of 1995 International Symposium on Power Semiconductor Devices and ICs, pp. 136–140 1995.
Ludikhuize, A Versatile 700–1200–V IC Process for Analog and Switching Applications, IEEE Transactions on Electron Devices, pp. 1582–1589 Jul. 1991.
Andreini et al., A New Integrated Silicon Gate Technology Combining Bipolar Linear, CMOS Logic, and DMOS Power Parts, IEEE Transactions on Electronic Devices, vol. ED-33, No. 12, pp. 2025–2030 Dec. 1986.
Lin et al., A Novel LDMOS Structure with a Step Gate Oxide, IEDM 95, pp. 38.2.1–38.2.4 1995.
Gallagher, "Italy's SGS Claims Lean in Vertical PNP Devices," Electronics, vol. 59, No. 2, p. 22 (1986).

*Primary Examiner*—Carl Whitehead, Jr.
*Attorney, Agent, or Firm*—Robert Groover; Betty Formby

[57] ABSTRACT

A diode integrated on semiconductor material with BCD technology and of the type provided on a substrate having a first type of conductivity inside an isolation region having a second type of conductivity. The diode comprises also a buried anode region having a first type of conductivity and a cathode region having a second type of conductivity. The cathode region comprises an epitaxial layer located above the buried anode region and a highly doped region provided inside the epitaxial layer. The buried anode region comprises depressions opposite which is located the highly doped region with the depressions being achieved by the intersection of lateral diffusions of distinct and adjacent portions of the buried anode region.

28 Claims, 2 Drawing Sheets

SEMICONDUCTOR DIODE INTEGRATED WITH BIPOLAR/CMOS/DMOS TECHNOLOGY

CROSS-REFERENCE TO RELATED APPLICATION

This application claims priority from EPC App'n 94830266.6, filed May 31, 1994, which is hereby incorporated by reference. However, the content of the present application is not necessarily identical to that of the priority application.

BACKGROUND AND SUMMARY OF THE INVENTION

The present invention relates to a semiconductor diode and specifically to low leakage semiconductor diodes integrated with Bipolar/CMOS/DMOS (BCD) technology.

In accordance with the known art a low leakage diode structure comprises a diffused anode region on which is provided a cathode region comprising a type N epitaxial layer with high resistivity and a type N highly doped region.

As known, the breakdown voltage of the junction of a low leakage diode depends on the characteristics of the epitaxial layer and in particular on the thickness of the epitaxial layer portion between the highly doped cathode region and the underlying diffused anode region.

More precisely, this value depends upon the distance between these two regions. The breakdown voltage depends also on the resistivity of the epitaxial layer. To increase this value without changing the manufacturing process (and incurring a resulting cost increase), it is necessary to act upon the thickness and/or resistivity of the epitaxial layer. However, these characteristics are generally fixed in such a manner as to optimize the performance of the power components which, with integrated circuits achieved with BCD technology, are represented by DMOS transistors.

The technical problem underlying the present invention is to provide a semiconductor diode integrated with BCD technology having high breakdown voltage of the junction without changing the manufacturing process phases nor the characteristics of the epitaxial layer.

The disclosed inventions provide a diode structure in which the distance between the diffused anode region and the highly doped cathode region is increased without changing the diode manufacturing process nor the thickness and/or resistivity of the epitaxial layer.

The technical problem is solved by a semiconductor diode integrated with BCD technology, in which the anode is formed by a patterned updiffusion which is complementary to the patterned surface diffusion which provides the cathode contacts. (The cathode is formed by an epitaxial layer in combination with this surface diffusion.) The patterned updiffusion of the anode provides a junction contour with depressions in it, and these depressions are located opposite the surface diffusion portions of the cathode. Preferably this uses a process in which two buried layers are available, so that a lower buried layer can provide isolation.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
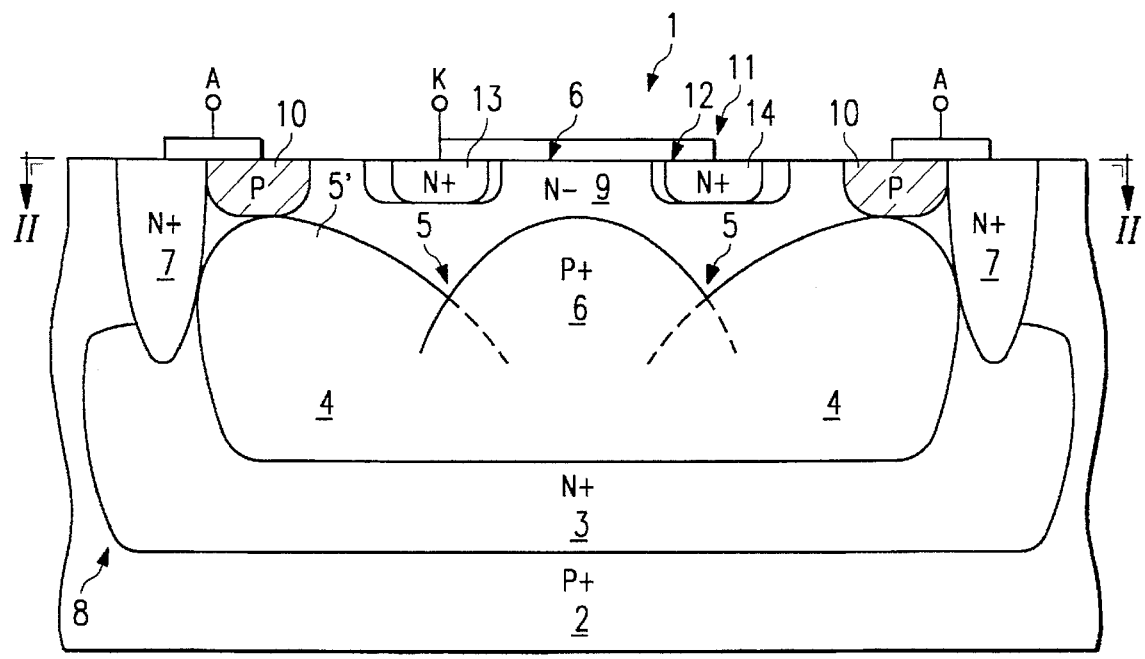
FIG. 1 shows a diagram in enlarged scale and vertical cross section of a semiconductor diode provided in accordance with the present invention.

The numerous innovative teachings of the present application will be described with particular reference to the presently preferred embodiment (by way of example, and not of limitation), in which:

With reference to the figures reference number 1 indicates as a whole and schematically a semiconductor diode provided in accordance with the present invention.

For convenience of discussion the structure of the diode 1 in accordance with the present invention is now described with reference to the process phases which lead to its realization. For the manufacture of the diode there is used a substrate 2 of semiconductor material, e.g. silicon, having a first type of conductivity and specifically type P. On the substrate 2 is provided by antimony ion implantation and subsequent diffusion heat treatment a first buried region 3 having a second type of conductivity and specifically type N.

Subsequently, on this first buried region 3 is provided by boron ion implantation a second buried region 4 with anode function and having the first type of conductivity. For the formation of the second buried region 4 there is used a mask with appropriate windows so as to achieve boron ion implantation concentrated in distinct and regularly spaced portions overlying the buried first region 3.

In this manner, by successive diffusion heat treatments, by utilizing the lateral diffusion of the distinct anode portions, the second buried region 4 takes on a configuration with multiple depressions 5 achieved each by the intersection of the lateral diffusions of adjacent distinct portions.

The manufacturing process of the diode 1 continues with the growth of an epitaxial layer 6 having the second type of conductivity. In the epitaxial layer 6 is then performed a phosphorous ion implantation which by subsequent diffusion will originate a first deep annular region 7 having the second type of conductivity in contact with the buried first region 3. This diffusion allows formation of an isolation region 8 designed to inhibit turning on of a PNP parasitic transistor present towards the isolation. Inside a portion 9 of epitaxial layer 6 included in the first deep annular region 7 is provided by boron ion implantation and subsequent diffusion heat treatment a second deep annular region 10 with anode function and having a first type of conductivity and in contact with the second buried region 4. Again inside the portion 9 of epitaxial layer 6 by arsenic ion implantation and subsequent diffusion heat treatment there is achieved a highly doped region 11 having the second type of conductivity.

At the end of the manufacturing process of the diode 1 the cathode region 12 is formed from the portion 9 of epitaxial layer included in the deep annular region 10 and from the highly doped region 11. Specifically the highly doped region 11 comprises at least two structurally independent regions 13, 14 located opposite the depressions 5 of the second buried region 4. Advantageously (thanks to this particular conformation of the diode 1) the distance between the second buried region 4 and the highly doped region 11 and consequently the breakdown voltage of the junction of diode 1 is increased. (In general, the breakdown voltage will be determined by the spreading of the depletion region around the boundary between up-diffused P+ regions 5 and the N-epitaxial region 9.)

In addition this result was achieved without changing the manufacturing process of the diode nor the characteristics of the epitaxial layer 6. Furthermore, having moved the highly doped region 11 away from the second buried region 4, impurities having the first type of conductivity are prevented from spreading in the highly doped region 11 during diffusion of the second buried region 4. In this manner the diode current leakage value is further lowered. In addition, the second buried region 4 being formed by the intersection of adjacent lateral diffusions, this region has lower doping and hence originates less crystallographic defects in the epitaxial layer 6.

In the presently preferred embodiment, the following doses and energies are used in fabricating the innovative diode structure:

region 1: 5E15 (i.e. $5 \times 10^{15}$) $cm^{-2}$ at 50 keV;

region 10: 1E13 $cm^{-2}$ at 70 keV;

region 7: doped (with the sinker predeposition) to a sheet resistance in the range of 5–7 $\Omega/\square$;

region 4: 2.5E14 $cm^{-2}$ at 150 keV;

region 3: 2.5E15 $cm^{-2}$ at 80 keV.

Of course these values are merely illustrative and can readily be varied.

Note that the cathode regions 13, 14 are preferably each formed as a double diffusion: the laterally extended part of the diffusion serves to reduce leakage, because the extended junction depth embeds defects. (The structure of the parasitic PNP associated with the diode then reduces the current losses toward the substrate when the diode is forward biased.)

The typical upward diffusion length of the diffusion 4 is in the range of 6–8 µm. The vertical variation in junction depth due to the updiffusion of diffusion 4 is in the neighborhood of ±1 µm.

Figure 2:
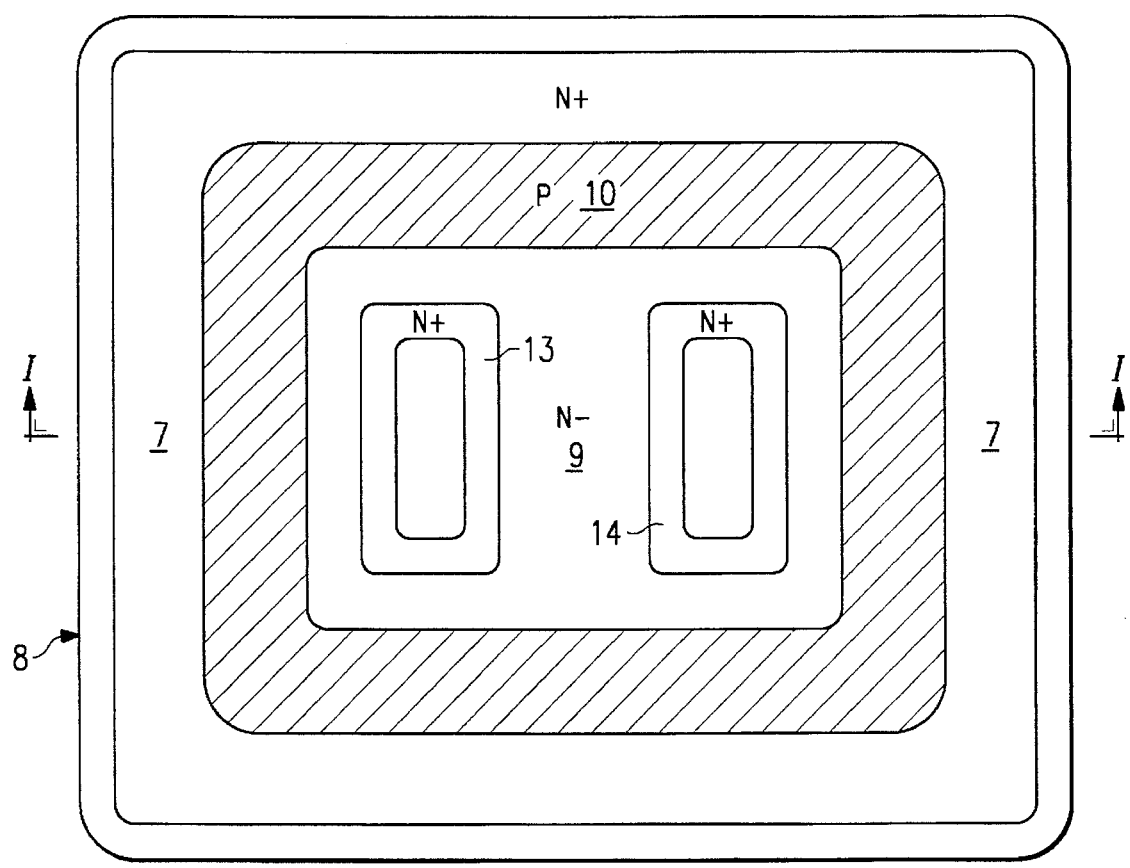
FIG. 2 shows a top view of the diode of FIG. 1.
Figure 3:
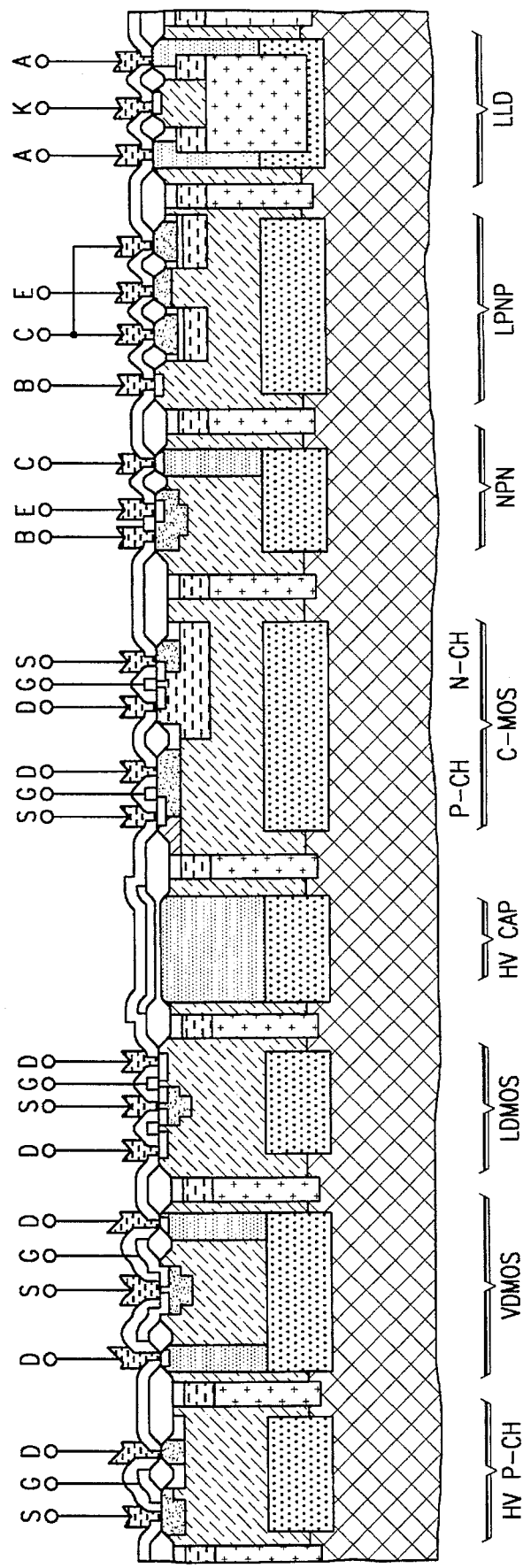
FIG. 3 shows a composite cross-section of devices made by a hybrid process which provides low-leakage diodes as well as other components.

FIG. 3 is a very schematic cross-section of devices made by a hybrid process (BCD-II). This figure is a composite view, which shows the range of device types available in this process. The isolation structures and lateral dimensions have been compressed to facilitate side-by-side comparison of the device structures, but the vertical dimensions and shadings indicate corresponding diffusions. From left to right, the structures include: a high-voltage PMOS transistor; an N-channel Vertical DMOS (VDMOS) transistor; a lateral DMOS (LDMOS) transistor; a high-voltage capacitor; small-signal PMOS and NMOS transistors, for CMOS logic; an npn bipolar transistor; a lateral PNP transistor; and a low-leakage diode like that shown in FIGS. 1 and 2.

According to a disclosed class of innovative embodiments, there is provided: An integrated circuit diode structure having monolithic semiconductor surface portions at a first surface thereof; first diffusions of a first conductivity type at said first surface; second diffusions which have a second conductivity type, which are removed from said first surface, and which have a profile characteristic of updiffusion from multiple laterally separated diffusion sources; said first and second diffusions being laterally misaligned; and said first and second diffusions being separated by a portion of said monolithic semiconductor surface portion which is more lightly doped than both said first and second diffusions.

According to another disclosed class of innovative embodiments, there is provided: An integrated circuit diode structure having monolithic semiconductor surface portions at a first surface thereof; first diffusions of a first conductivity type at the first surface; second diffusions which have a second conductivity type, which are removed from the first surface, and which have a profile characteristic of outdiffusion from multiple laterally separated diffusion sources; and the first diffusions corresponding to outdiffusion from first respective diffusion sources, and the second diffusions corresponding to outdiffusion from second respective diffusion sources, and wherein the first diffusion sources do not overlie the second diffusion sources; and the first and second diffusions being separated by a portion of the monolithic semiconductor surface portion which is more lightly doped than both the first and second diffusions.

According to another disclosed class of innovative embodiments, there is provided: An integrated circuit diode structure having monolithic semiconductor surface portions at a first surface thereof; first diffusions of a first conductivity type at the first surface; second diffusions which have a second conductivity type, which are removed from the first surface, and which have a profile characteristic of outdiffusion from multiple laterally separated diffusion sources; and third diffusions underlying and laterally surrounding the first and second diffusions; the first and second diffusions each including multiple elongated stripes, and being mutually interdigitated in a pattern which provides lateral offset between the first and second diffusions; and the first and second diffusions being separated by a portion of the monolithic semiconductor surface portion which is more lightly doped than both the first and second diffusions.

According to another disclosed class of innovative embodiments, there is provided: A diode integrated on a semiconductor material with BCD technology of the type provided on a substrate having a first type of conductivity inside an isolation region having a second type of conductivity and comprising a buried anode region having a first type of conductivity and a cathode region having a second type of conductivity and the cathode region comprising an epitaxial layer located above the buried anode region and a highly doped region provided inside the epitaxial layer and characterized in that the buried anode region comprises depressions; opposite which is located the highly doped region.

According to another disclosed class of innovative embodiments, there is provided: A manufacturing process for a diode integrated on semiconductor material with BCD technology and the diode comprising a buried anode region having a first type of conductivity and a cathode region having a second type of conductivity and the cathode region comprising an epitaxial layer located above the buried anode region and a highly doped region provided inside the epitaxial layer, comprising the steps of: performing a first masking to provide the buried anode region in a pattern which is concentrated in distinct portions, subsequently performing epitaxial growth and diffusion in a manner such that the buried anode region takes on a configuration comprising depressions achieved by the intersection of lateral diffusions of distinct and adjacent portions, and performing a second masking to provide the cathode region opposite the depressions included in the buried anode region.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For example, the disclosed device structure can advantageously be adapted to geometries other than interdigitated fingers of the presently preferred embodiment, e.g. to a checkerboard geometry.

For another example, the disclosed alternating pattern of surface diffusion stripes and buried updiffusion stripes can also (alternatively and less preferably) be applied to other vertical-current-flow devices, such as thyristors, VDMOS transistors, or power bipolar transistors.

What is claimed is:

1. An integrated circuit diode structure having monolithic semiconductor surface portions at a first surface thereof;
   first diffusions of a first conductivity type at said first surface;
   second diffusions
      which have a second conductivity type,
      which are removed from said first surface, and
      which have a profile characteristic of updiffusion from multiple laterally separated diffusion sources;
   said first and second diffusions being laterally misaligned; and
   said first and second diffusions being separated by a portion of said monolithic semiconductor surface portion which is more lightly doped than both said first and second diffusions.

2. The structure of claim 1, further comprising an additional diffusion of a second conductivity type, which extends from said first surface to provide ohmic contact to said second diffusion.

3. The structure of claim 1, wherein said second conductivity type is P-type.

4. The structure of claim 1, wherein said semiconductor portions consist essentially of silicon.

5. The structure of claim 1, further comprising a third diffusions underlying and laterally surrounding said first and second diffusions to provide junction isolation thereof.

6. The structure of claim 1, wherein said monolithic semiconductor surface portions are portions of an epitaxial layer which overlies a semiconductor substrate.

7. The structure of claim 1, wherein said monolithic semiconductor surface portions have said first conductivity type.

8. An integrated circuit diode structure having monolithic semiconductor surface portions at a first surface thereof;
   first diffusions of a first conductivity type at said first surface;
   second diffusions
      which have a second conductivity type,
      which are removed from said first surface, and
      which have a profile characteristic of outdiffusion from multiple laterally separated diffusion sources; and
   said first diffusions corresponding to outdiffusion from first respective diffusion sources, and said second diffusions corresponding to outdiffusion from second respective diffusion sources, and wherein said first diffusion sources do not overlie said second diffusion sources; and
   said first and second diffusions being separated by a portion of said monolithic semiconductor surface portion which is more lightly doped than both said first and second diffusions.

9. The structure of claim 8, further comprising an additional diffusion of a second conductivity type, which extends from said first surface to provide ohmic contact to said second diffusion.

10. The structure of claim 8, further comprising a third diffusions underlying and laterally surrounding said first and second diffusions to provide junction isolation thereof.

11. The structure of claim 8, further comprising an additional diffusion of a second conductivity type, which extends from said first surface to provide ohmic contact to said second diffusion.

12. The structure of claim 8, wherein said second conductivity type is P-type.

13. The structure of claim 8, wherein said monolithic semiconductor surface portions are portions of an epitaxial layer which overlies a semiconductor substrate.

14. The structure of claim 8, wherein said monolithic semiconductor surface portions have said first conductivity type.

15. An integrated circuit diode structure having monolithic semiconductor surface portions at a first surface thereof;
   first diffusions of a first conductivity type at said first surface;
   second diffusions
      which have a second conductivity type,
      which are removed from said first surface, and
      which have a profile characteristic of outdiffusion from multiple laterally separated diffusion sources; and
   third diffusions underlying and laterally surrounding said first and second diffusions;
   said first and second diffusions each including multiple elongated stripes, and being mutually interdigitated in a pattern which provides lateral offset between said first and second diffusions; and
   said first and second diffusions being separated by a portion of said monolithic semiconductor surface portion which is more lightly doped than both said first and second diffusions.

16. The structure of claim 15, further comprising an additional diffusion of a second conductivity type, which extends from said first surface to provide ohmic contact to said second diffusion.

17. The structure of claim 15, further comprising a third diffusions underlying and laterally surrounding said first and second diffusions to provide junction isolation thereof.

18. The structure of claim 15, further comprising an additional diffusion of a second conductivity type, which extends from said first surface to provide ohmic contact to said second diffusion.

19. The structure of claim 15, wherein said second conductivity type is P-type.

20. The structure of claim 15, wherein said monolithic semiconductor surface portions are portions of an epitaxial layer which overlies a semiconductor substrate.

21. The structure of claim 15, wherein said monolithic semiconductor surface portions have said first conductivity type.

22. A diode integrated on a semiconductor material with BCD technology of the type provided on a substrate having a first type of conductivity inside an isolation region having a second type of conductivity and comprising a buried anode region having a first type of conductivity and a cathode region having a second type of conductivity and said cathode region comprising an epitaxial layer located above said buried anode region and a highly doped region provided inside said epitaxial layer wherein said highly doped region is located opposite depressions in said buried anode region.

23. The diode of claim 22, wherein said depressions are achieved by the intersection of lateral diffusions of distinct and adjacent portions of the buried anode region.

24. The diode of claim 22, wherein said highly doped region comprises at least two structurally independent regions.

25. The diode of claim 22, wherein each of said regions is located opposite at least one depression included in the buried anode region.

26. The diode of claim 22, wherein said depression is achieved by the intersection of the lateral diffusions of at least two distinct and adjacent portions of the buried anode region.

27. The diode of claim 22, wherein the buried anode region has a type P conductivity.

28. The diode of claim 22, wherein the regions included in the highly doped region have a type N conductivity.

* * * * *